(12) United States Patent
Lee et al.

(10) Patent No.: US 7,977,155 B2
(45) Date of Patent: Jul. 12, 2011

(54) WAFER-LEVEL FLIP-CHIP ASSEMBLY METHODS

(75) Inventors: Chien-Hsiun Lee, Hsin-Chu (TW);
Clinton Chao, Hsin-Chu (TW);
Ming-Chung Sung, Taichung (TW);
Tjandra Winata Karta, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 181 days.

(21) Appl. No.: 11/800,386

(22) Filed: May 4, 2007

(65) Prior Publication Data

US 2008/0274589 A1 Nov. 6, 2008

(51) Int. Cl.
*H01L 21/00* (2006.01)
*H01L 21/66* (2006.01)

(52) U.S. Cl. ............. 438/106; 438/15; 438/108
(58) Field of Classification Search .......... 438/15, 438/106, 108
See application file for complete search history.

(56) References Cited

U.S. PATENT DOCUMENTS

| | | | |
|---|---|---|---|
| 6,297,560 B1 * | 10/2001 | Capote et al. ............ | 257/778 |
| 6,534,874 B1 * | 3/2003 | Matsumura ............... | 257/777 |
| 6,558,977 B2 * | 5/2003 | Nakaoka et al. ........... | 438/107 |
| 6,809,421 B1 * | 10/2004 | Hayasaka et al. .......... | 257/777 |
| 6,812,549 B2 * | 11/2004 | Umetsu et al. ............ | 257/621 |
| 6,841,883 B1 * | 1/2005 | Farnworth et al. ......... | 257/777 |
| 6,882,058 B2 | 4/2005 | Chan et al. | |
| 6,903,443 B2 * | 6/2005 | Farnworth et al. ......... | 257/621 |
| 6,975,035 B2 | 12/2005 | Lee | |
| 7,022,410 B2 | 4/2006 | Tonapi et al. | |
| 7,030,466 B1 * | 4/2006 | Hsuan ..................... | 257/621 |
| 7,452,747 B2 * | 11/2008 | Chan et al. ............... | 438/106 |
| 7,504,733 B2 * | 3/2009 | Lopez ..................... | 257/778 |
| 7,569,920 B2 * | 8/2009 | Otremba et al. ........... | 257/686 |
| 7,736,950 B2 * | 6/2010 | Pendse et al. ............. | 438/108 |
| 2001/0019853 A1 * | 9/2001 | Kroner ..................... | 438/108 |
| 2003/0230797 A1 * | 12/2003 | Mashino .................. | 257/686 |
| 2005/0121762 A1 * | 6/2005 | Shi .......................... | 257/678 |
| 2005/0130343 A1 * | 6/2005 | Lebonheur et al. ........ | 438/106 |
| 2005/0218517 A1 * | 10/2005 | Capote et al. ............. | 257/738 |
| 2006/0121646 A1 * | 6/2006 | Koning et al. ............. | 438/118 |
| 2006/0200985 A1 * | 9/2006 | Workman et al. .......... | 29/860 |
| 2006/0205116 A1 * | 9/2006 | Benson et al. ............. | 438/118 |
| 2007/0037320 A1 * | 2/2007 | Mostafazadeh et al. .... | 438/108 |
| 2007/0090532 A1 * | 4/2007 | Lehman ................... | 257/777 |
| 2007/0092996 A1 * | 4/2007 | Lo et al. .................. | 438/108 |
| 2007/0181992 A1 * | 8/2007 | Lake ....................... | 257/698 |
| 2007/0290300 A1 * | 12/2007 | Kawakami ................ | 257/621 |
| 2008/0017995 A1 * | 1/2008 | Karashima et al. ........ | 257/778 |

FOREIGN PATENT DOCUMENTS

JP 2003082064 * 3/2003

* cited by examiner

*Primary Examiner* — Matthew C Landau
*Assistant Examiner* — James M Mitchell
(74) *Attorney, Agent, or Firm* — Slater & Matsil, L.L.P.

(57) ABSTRACT

A method of packaging integrated circuit structures is provided. The method includes providing a wafer having bonding conductors on a surface of the wafer, and applying a compound underfill onto the surface of the wafer. The compound underfill includes an underfill material and a flux material. A die is then bonded on the wafer after the step of applying the compound underfill, wherein solder bumps on the die are joined with the bonding conductors.

5 Claims, 6 Drawing Sheets

WAFER-LEVEL FLIP-CHIP ASSEMBLY METHODS

TECHNICAL FIELD

This invention relates generally to integrated circuit manufacturing processes, and more particularly to die-to-wafer bonding processes.

BACKGROUND

Interposers are used for integrated circuit packaging, typically for routing connections between semiconductor dies and packaging components. For example, semiconductor dies may have tightly-spaced bonding pads, which are inconvenient for packaging processes. Interposers may thus be used for space-transforming, and more particularly, increasing the pitches of the semiconductor dies.

FIG. 1 illustrates a cross-sectional view of an intermediate stage for bonding dies 12 and 14 on interposer wafer 10. Interposer wafer 10 includes copper posts 16 connected to bonding pads 19, which are further bonded to solder balls 20. Dies 12 and 14 are mounted with copper posts 16 through solder bumps 18.

Typically, the bonding process includes pre-mounting solder bumps 18 onto dies 12 and 14, applying flux to copper posts 16, and then bonding dies 12 and 14 onto interposer wafer 10, wherein solder bumps 18 are placed against copper posts 16. After the reflow process for joining solder bumps 18 with copper posts 16, underfill 22 is dispensed into the gaps between dies 12 and 14 and underlying interposer wafer 10. In conventional processes, underfill dispenser 24, which includes needle 26, is used to dispense underfill 22 onto interposer wafer 10 through gap 28 (and gaps between dies 12 and 14 and other neighboring dies). The underfill is then drawn into the gaps between solder bumps 18 by a capillary effect.

The conventional bonding process suffers shortcomings. It is preferred that the width W1 of gap 28 is as small as possible, so that no interposer wafer space is wasted. On the other hand, with the reduction in the width W1 of gap 28, it is hard to dispense underfill through gap 28. The problem further escalates with the down-scaling of dies. Typically, width W1 of gap 28 is required to be greater than about 1 mm.

A further shortcoming in the conventional process is the difficulty in the cleaning process performed after the reflow of solder bumps 18. The undesired substances, such as leftover flux, must be removed. However, with the increasingly smaller width W1 and smaller width W2 between interposer wafer 10 and dies 12 and 14, the cleaning process becomes increasingly more difficult. New bonding processes are thus needed.

SUMMARY OF THE INVENTION

In accordance with one aspect of the present invention, a method of packaging integrated circuit structures is provided. The method includes providing a wafer having bonding conductors on a surface of the wafer, and applying a compound underfill onto the surface of the wafer. The compound underfill includes an underfill material and a flux material. A die is then bonded on the wafer after the step of applying the compound underfill, wherein solder bumps on the die are joined with the bonding conductors.

In accordance with another aspect of the present invention, a method of forming an integrated circuit structure includes providing a wafer comprising bonding conductors on the wafer, and providing a die comprising solder bumps thereon. A compound underfill is applied onto the wafer, wherein at least portions of the bonding conductors are buried in the compound underfill. The die is aligned to the wafer and pressed against the compound underfill, so that the solder bumps on the die penetrate the compound underfill and contact the bonding conductors. The solder bumps are then reflowed. The compound underfill is then cured.

In accordance with yet another aspect of the present invention, a method of forming an integrated circuit structure includes providing a wafer comprising bonding conductors on the wafer, and a first and a second die each comprising solder bumps thereon. A compound underfill is applied onto the wafer, wherein the bonding conductors are buried in the compound underfill. The first and the second dies are aligned to the wafer and pressed against the compound underfill, such that the solder bumps on the first and the second dies penetrate the compound underfill and are in contact with the bonding conductors. Wafer regions between the first and the second dies are preferably free from the compound underfill. The method further includes reflowing the solder bumps and curing the compound underfill.

The advantageous features of the present invention include reduced distances between dies bonded on wafer so that wafer area is saved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for bonding dies onto wafers are provided by the embodiments of the present invention. The intermediate stages of performing the preferred embodiments of the present invention are illustrated. Throughout the various views and illustrative embodiments of the present invention, like reference numbers are used to designate like elements.

Figure 1:
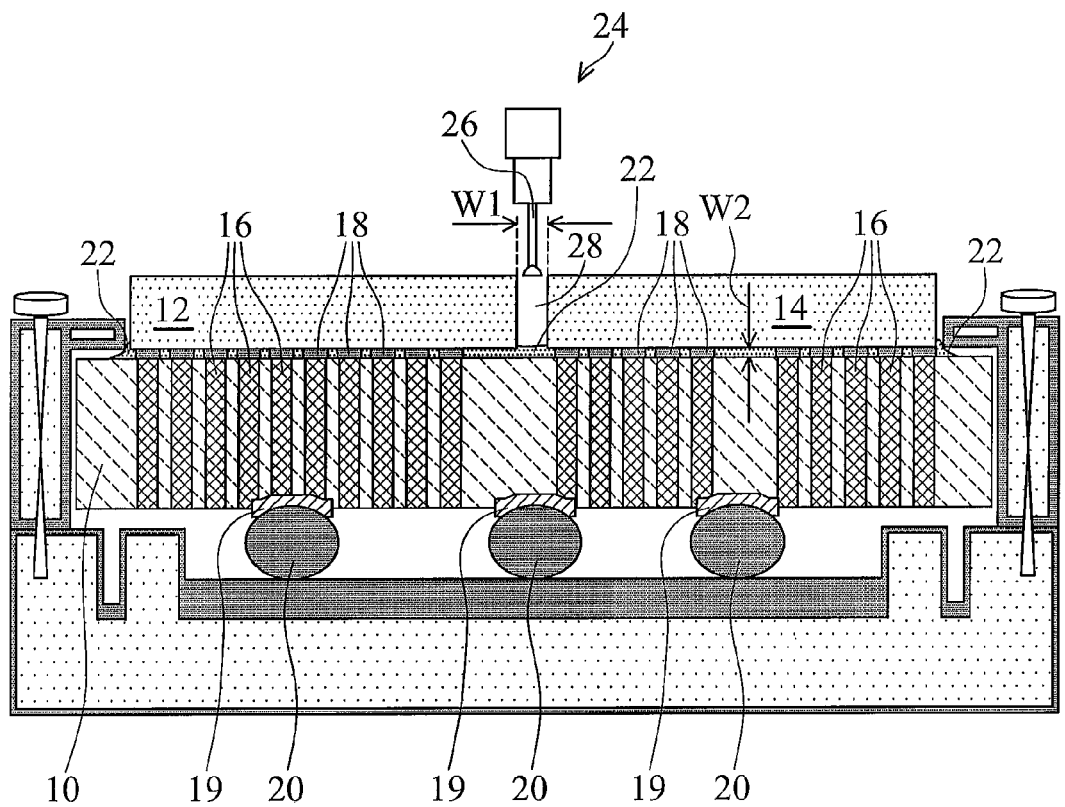
FIG. 1 illustrates a conventional process for bonding semiconductor dies onto an interposer wafer.
Figure 2A:
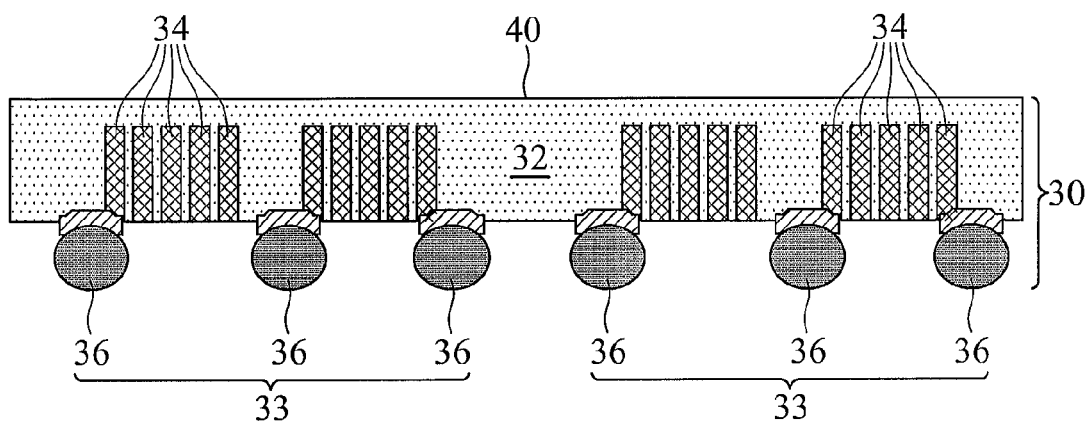
FIGS. 2A through 6 are cross-sectional views of intermediate stages in the manufacturing of an embodiment of the present invention, wherein semiconductor dies are bonded onto a wafer using a compound underfill comprising flux.

Referring to FIG. 2A, wafer 30 is provided. In an embodiment, wafer 30 is an interposer wafer, which includes base material 32 and copper posts 34 formed therein. In the preferred embodiment, base material 32 comprises silicon. In other embodiments, base material 32 comprises other commonly used semiconductor or dielectric materials, such as organic materials and ceramics. Copper posts 34 each have a first end buried in base material 32, and a second end connected to one of the bumps 36, or solder balls 36. The first ends of copper posts 34 are arranged corresponding to the bonding pads of semiconductor dies (not shown), which will be bonded to interposer wafer 30 in subsequent process steps.

Figure 2B:
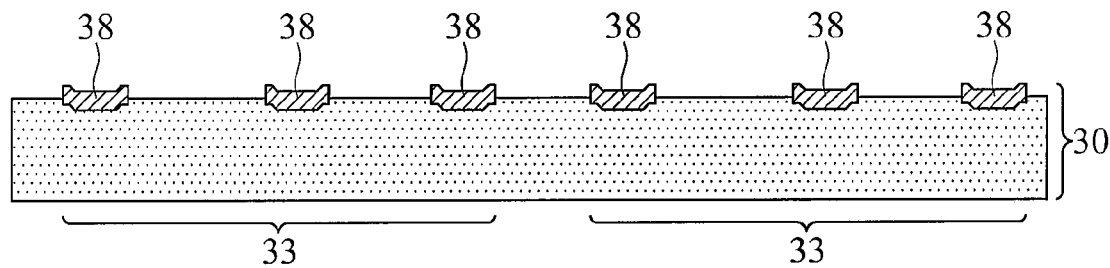

In alternative embodiments, as shown in FIG. 2B, wafer 30 is a semiconductor wafer including a plurality of semiconductor dies, which may include integrated circuits. The subsequent bonding process is thus commonly referred to as die-to-wafer bonding. Bonding pads 38 are formed on wafer 30, and are connected to the integrated circuits. For simplicity, FIGS. 2A and 2B only illustrate two dies 33 in wafer 30.

Figure 3:
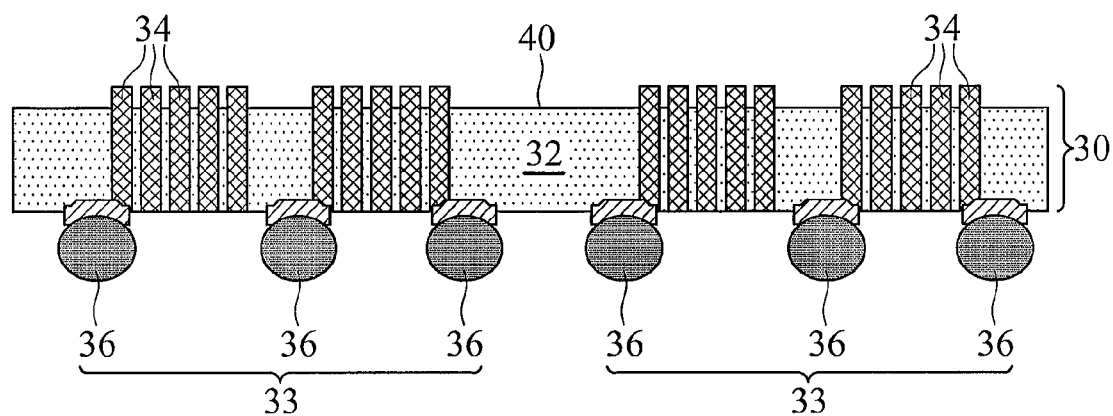

Referring to FIG. 3, the back surface 40 of interposer wafer 30 is thinned until the first ends of copper posts 34 are exposed. An etching is then performed to further recess the back surface 40 of base material 32, so that top portions of copper posts 34 stand outside of back surface 40.

Figure 4A:
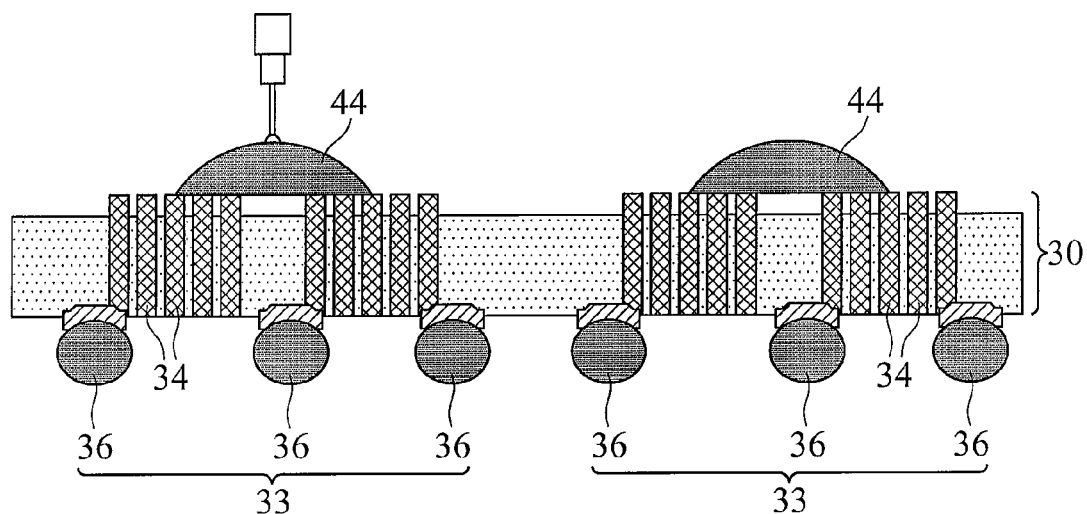

Referring to FIG. 4A, compound underfill 44, which includes both flux and underfill, is applied on wafer 30. As is known in the art, when cured, underfill has the ability to protect solder bumps from stresses, while the flux improves the fusion of metals, and hence the reflow process of solder bumps may be improved. Compound underfill 44 is preferably epoxy based, which may include resins. Silicone may be further added into compound underfill 44. Preferably, the underfill in compound underfill 44 is fast-curable. In an exemplary embodiment, the curing of the underfill can be performed in less than about ten minutes.

The flux in compound underfill 44 preferably includes lower amount of activators than conventional fluxes, which are separated from underfills. In alternative embodiments, the flux in compound underfill 44 includes activators having lesser strengths, such as Co+2, Co+3, and the like, than the conventional fluxes. In an exemplary embodiment, the flux includes less than about 1% percent activators. Accordingly, it is not necessary to remove the flux after the bonding process. Preferably, the flux in compound underfill 44 is hydrophobic. Advantageously, since the flux remains in the final structure, with a hydrophobic property, the flux will not absorb moisture, particularly the moisture in the underfill. As a result, the possible adverse affect to the performance of the resulting integrated circuit structure caused by the moisture is eliminated.

In the preferred embodiment, compound underfill 44 has a high viscosity, and hence a reduced ability to flow. More preferably, compound underfill 44 is substantially not flowable when dispensed onto interposer wafer 30. In an exemplary embodiment, the viscosity of compound underfill 44 is greater than about 3000 cps to about 8000 cps. Accordingly, after being disposed, compound underfill 44 will substantially stay where it is dispensed, without flowing to other locations of wafer 30. On the other hand, the viscosity is preferably not too great, so that in the subsequent bonding processes, little effort is required for solder bumps to be pressed through compound underfill 44. In an exemplary embodiment, the underfill in compound underfill 44 includes a hardener, Silica, epoxy, and combinations thereof, and the flux in compound underfill 44 comprises rosin, abiatics acid, subiatics acid, and combinations thereof.

Figure 4B:
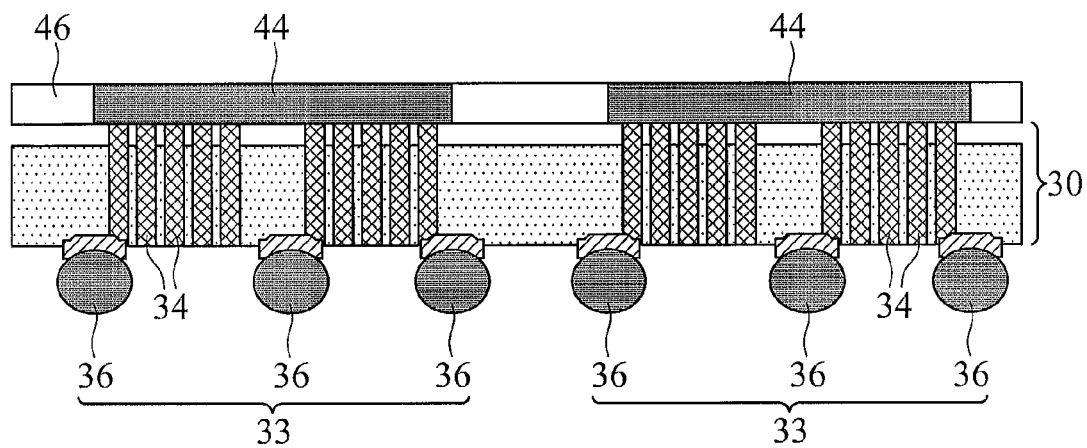

In a first embodiment, as shown in FIG. 4A, compound underfill 44 is dispensed only on dies 33, while the regions between dies 33, such as scribe lines, have no compound underfill dispensed thereon. In a second embodiment, as shown in FIG. 4B, stencil mask 46 is placed on interposer wafer 30, wherein stencil mask 46 includes a plurality of openings, through which each die 33 is exposed. Compound underfill 44 is then dispensed into the openings. Excess compound underfill 44 is removed, for example, wiped out by a bladder, so that compound underfill 44 is left only in the openings. Stencil mask 46 is then removed. In the preferred embodiment, the scribe lines between dies 33 are masked by stencil mask 46, and thus no compound underfill 44 is dispensed thereon. Preferably, compound underfill 44 covers all of the copper posts 34 (or bonding pads 38 in FIG. 2B). The amount of compound underfill 44 is preferably controlled so that no substantial overflow occurs during the subsequent bonding of dies onto wafer 30.

Figure 4C:
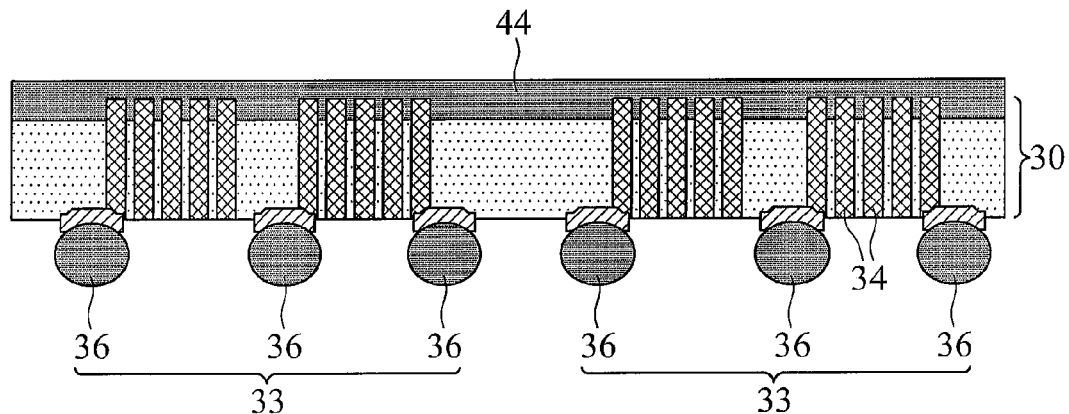

In a third embodiment, compound underfill 44 is applied as a substantially flat coating, as is shown in FIG. 4C. Preferably, the thickness of compound underfill 44 is substantially close to the height of the subsequently joined solder bumps. Please note that in the embodiments shown in FIGS. 4A, 4B and 4C, at least some of copper posts 34 (or bonding pads 38 as shown in FIG. 2B, if wafer 30 is a semiconductor wafer.), and possibly all, are buried in compound underfill 44.

Figure 5:
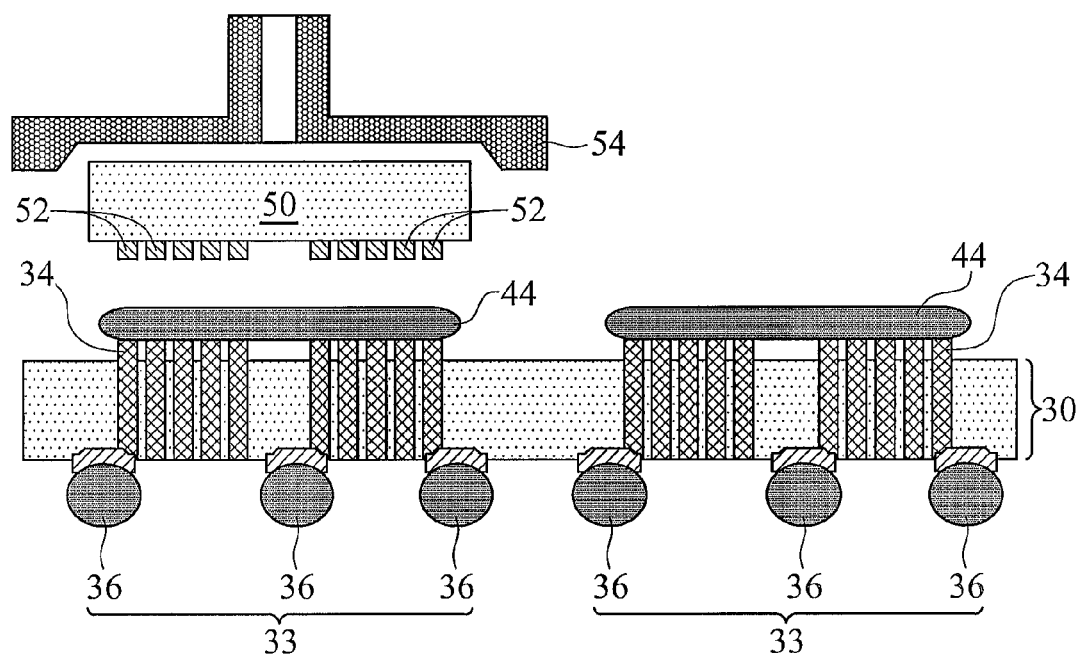

Referring to FIG. 5, die 50 is prepared. Preferably, die 50 includes integrated circuits formed therein. Solder bumps 52 are pre-mounted on a surface of die 50, and are connected to the integrated circuits in die 50. Bonding head 54 is used to transfer die 50 over, and aligned to, one of the dies 33. Die 50 is then pressed against interposer wafer 30, so that solder bumps 52 penetrate through compound underfill 44 until in contact with copper posts 34 (or bonding pads 38 as shown in FIG. 2B if wafer 30 is a semiconductor wafer). Excess compound underfill 44 may be squeezed sideways if the compound underfill 44 overflows from the gaps between dies 33 and 50. Preferably, if gaps between die 50 and its neighboring dies are wide, for example, with width W3 (refer to FIG. 6) of greater than about 300 μm, more compound underfill 44 can be applied, and excess compound underfill material will be squeezed out from the gaps. Otherwise, the amount of compound underfill 44 needs to be carefully controlled to ensure no excess overflows.

Figure 6:
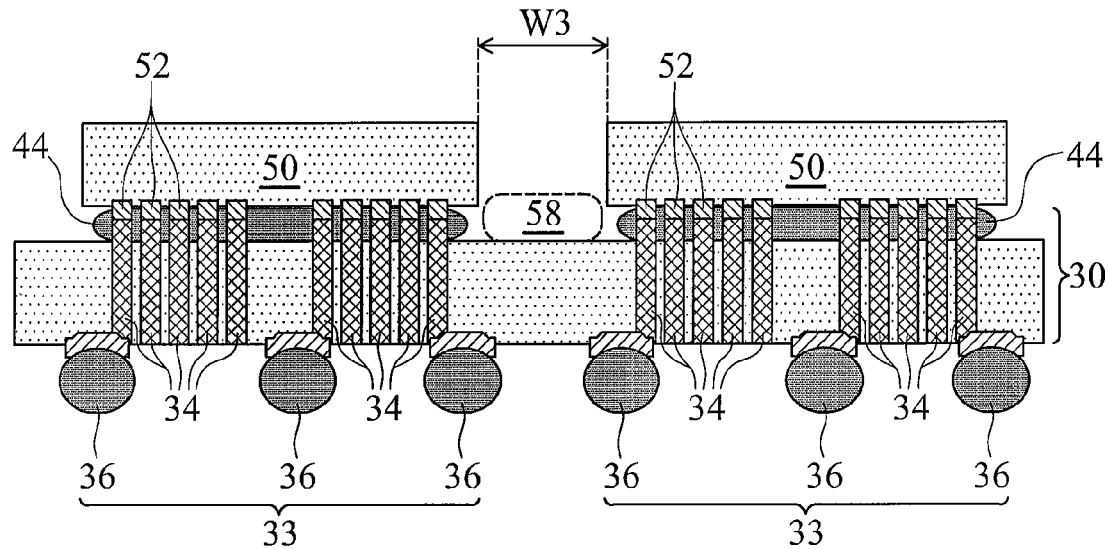

Referring to FIG. 6, if compound underfill 44 is carefully dispensed to cover only copper posts 34, and no overflow occurs, compound underfill 44 may be limited only in overlap regions between dies 50 and the corresponding underlying dies 33, while region 58, which is exposed to the gap between dies 50, may be free from compound underfill 44. This is different from the structure formed using conventional underfill-dispensing methods, in which the underfill is dispensed through the gap between dies 50, and thus region 58 would be dispensed with the underfill. After all dies 50 are placed onto wafer 30, a reflow is preformed so that solder bumps 52 are joined with the underlying copper posts 34 (or bonding pads 38 in FIG. 2B).

A curing process is then performed to solidify the underfill in compound underfill 44. In the preferred embodiment, the underfill is fast-curable, and thus the curing process is completed in less than ten minutes. After the curing process, no flux removal step is needed.

In the embodiments discussed in the preceding paragraphs, solder bumps are pre-mounted on dies 50 before the dies are bonded onto wafer 30. One skilled in the art will realize that solder bumps 52 may be pre-mounted onto wafer 30 before dies 50 are bonded onto wafer 30. Accordingly, the compound underfill 44 will bury at least some of the solder bumps.

Figure 7A:
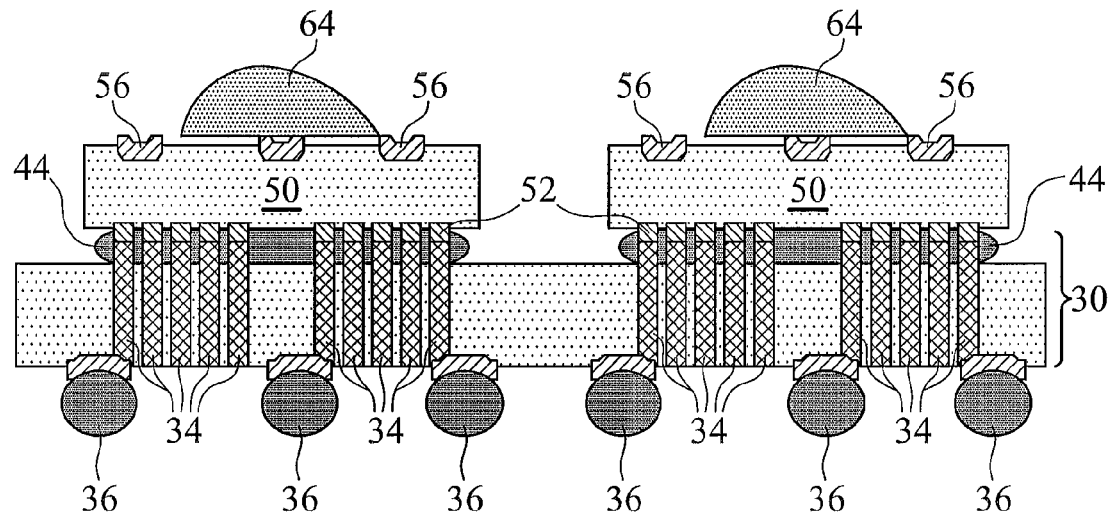
FIGS. 7A through 8 are cross-sectional views of intermediate stages in the stacking of additional dies on the structure shown in FIG. 6.
Figure 7B:
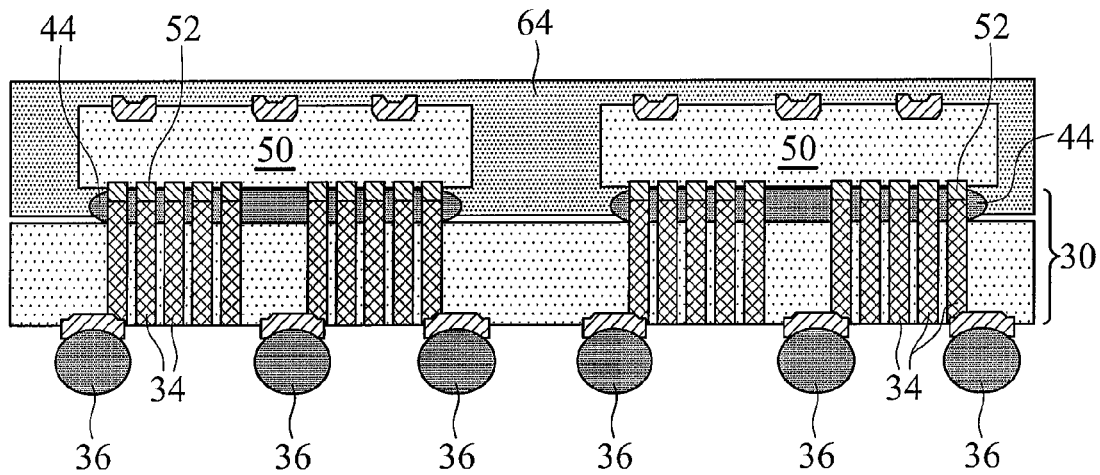
Figure 8:
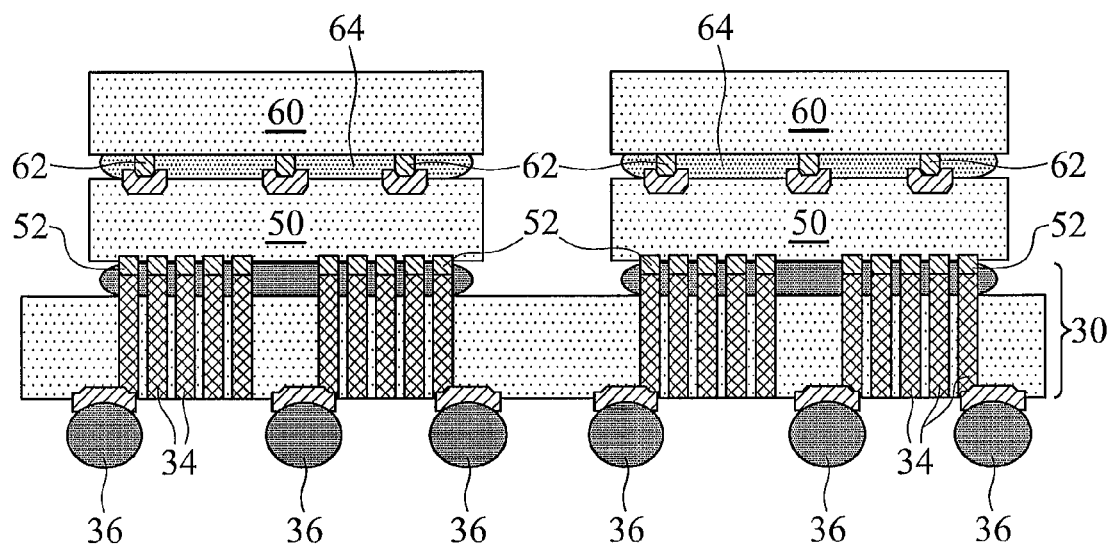

FIGS. 7A through 8 illustrate the stacking of more dies onto dies 50. To stack more dies, dies 50 preferably have bonding pads 56 on a side opposite the side on which solder bumps 52 are located. Dies 50 may further include through-silicon vias (not shown). A compound underfill is then dispensed on dies 50 using essentially the same methods as shown in FIGS. 4A through 4C. For example, in FIG. 7A, compound underfill 64 is dispensed over each of the dies 50. In FIG. 7B, compound underfill 64 is uniformly coated, and thus fills the gaps between dies 50. Compound underfill 64 may include essentially the same components as compound underfill 44.

FIG. 8 illustrates the bonding of dies 60 onto dies 50. Preferably, solder bumps 62 are pre-mounted on dies 60. Dies 60 are then bonded onto dies 50 using essentially the same methods as discussed in the preceding paragraphs. A reflow and a curing process are then performed.

The embodiments of the present invention have several advantageous features. Since compound underfill 44 is dispensed before the bonding of dies onto wafer 30, the space between dies may be reduced without causing difficulties to the subsequent underfill dispensing and flux removal processes. This is particularly advantageous for the formation of future generations of integrated circuits. In addition, the flux application and underfill dispensing is integrated into one step, resulting in a shorter cycle time.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing an interposer wafer comprising:
   first bonding conductors on a first side of the interposer wafer; and
   second bonding conductors on a second side of the interposer wafer opposite the first side, wherein the second bonding conductors are electrically coupled to the first bonding conductors through routing connections in the interposer wafer;
   providing a die comprising solder bumps thereon;
   applying a compound underfill onto the first bonding conductors of the interposer wafer, wherein the compound underfill comprises an underfill material and a flux material, wherein the flux material is hydrophobic, and wherein at least portions of the first bonding conductors are buried in the compound underfill;
   aligning the die to the interposer wafer and pressing the die against the compound underfill, so that the solder bumps on the die penetrate the compound underfill and contact the first bonding conductors;
   reflowing the solder bumps;
   curing the compound underfill;
   applying the compound underfill onto the die after the step of reflowing; and
   bonding an additional die onto the die.

2. The method of claim 1, wherein the first bonding conductors on the interposer wafer are flux-free before the step of applying the compound underfill.

3. The method of claim 1, wherein the interposer wafer is a semiconductor interposer wafer comprising active circuits, and wherein the first bonding conductors comprise bonding pads.

4. The method of claim 1, wherein a portion of the compound underfill is filled in gaps between the die and neighboring dies on a same level, and wherein a top surface of the portion of the compound underfill in the gaps is higher than a top surface of the die.

5. The method of claim 1, wherein the compound underfill is substantially non-flowable before the step of curing the compound underfill.

* * * * *